US011272623B2

(12) United States Patent
Sonohara

(10) Patent No.: US 11,272,623 B2
(45) Date of Patent: Mar. 8, 2022

(54) WIRING SUBSTRATE AND METHOD FOR PRODUCING WIRING SUBSTRATE

(71) Applicant: NGK SPARK PLUG CO., LTD., Nagoya (JP)

(72) Inventor: Yosuke Sonohara, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 106 days.

(21) Appl. No.: 16/618,606

(22) PCT Filed: May 28, 2018

(86) PCT No.: PCT/JP2018/020313
§ 371 (c)(1),
(2) Date: Dec. 2, 2019

(87) PCT Pub. No.: WO2018/225555
PCT Pub. Date: Dec. 13, 2018

(65) Prior Publication Data
US 2020/0196455 A1    Jun. 18, 2020

(30) Foreign Application Priority Data
Jun. 7, 2017  (JP) .............................. JP2017-112643

(51) Int. Cl.
*H05K 1/02* (2006.01)
*H05K 3/24* (2006.01)
*H05K 3/18* (2006.01)

(52) U.S. Cl.
CPC ........... *H05K 3/242* (2013.01); *H05K 1/0298* (2013.01); *H05K 3/188* (2013.01); *H05K 2201/0338* (2013.01)

(58) Field of Classification Search
CPC ...... H05K 3/242; H05K 1/0298; H05K 3/188; H05K 2201/0338; H05K 2203/1476; H05K 3/108; H05K 1/111; H05K 3/244
See application file for complete search history.

(56) References Cited

U.S. PATENT DOCUMENTS 4,351,704 A  *  9/1982  Kurihara .................. C25D 5/02
                                                204/192.14
5,071,518 A  *  12/1991 Pan ................... H01L 21/76886
                                                205/122
(Continued)

FOREIGN PATENT DOCUMENTS

JP     S50-013881 A    2/1975
JP     H05-075258 A    3/1993
(Continued)

OTHER PUBLICATIONS

Japan Patent Office, International Search Report issued in corresponding Application No. PCT/JP2018/020313 dated Aug. 21, 2018.

*Primary Examiner* — Steven T Sawyer
(74) *Attorney, Agent, or Firm* — Stites & Harbison, PLLC; Jeffrey A. Haeberlin; James R. Hayne

(57) ABSTRACT

A wiring substrate includes an insulating layer having a front surface and a back surface and at least two wiring parts that are disposed at least on the front surface of the insulating layer and that are insulated from each other. At least one of the wiring parts is electrically isolated on the insulating layer. Each of the wiring parts includes a conductive base layer disposed on the front surface of the insulating layer, a conductive layer disposed on a front surface of the conductive base layer, and a conductive covering layer arranged to cover at least a portion of a front surface of the conductive layer, at least a portion of a side surface of the conductive base layer, and at least a portion of a side surface of the (Continued)

conductive layer. The conductive base layer and the conductive layer overlap and coincide with each other in plan view.

2 Claims, 9 Drawing Sheets

(56) References Cited

U.S. PATENT DOCUMENTS

| | | | |
|---|---|---|---|
| 2007/0111401 A1* | 5/2007 | Kataoka | H05K 3/06 438/128 |
| 2010/0309641 A1* | 12/2010 | Hata | H05K 3/3457 361/783 |
| 2013/0075141 A1 | 3/2013 | Suzuki et al. | |
| 2018/0166372 A1* | 6/2018 | Shimizu | H01L 23/49827 |

FOREIGN PATENT DOCUMENTS

| | | |
|---|---|---|
| JP | 2001-068828 A | 3/2001 |
| JP | 2003-224348 A | 8/2003 |
| JP | 2009-212212 A | 9/2009 |
| JP | 2013-069876 A | 4/2013 |

* cited by examiner

PRIOR ART

WIRING SUBSTRATE AND METHOD FOR PRODUCING WIRING SUBSTRATE

CROSS REFERENCES TO RELATED APPLICATIONS

This international application claims priority based on Japanese Patent Application No. 2017-112643 filed in the Japan Patent Office on Jun. 7, 2017. The entire contents of Japanese Patent Application No. 2017-112643 are incorporated in this international application by reference.

TECHNICAL FIELD

The present disclosure relates to a wiring substrate and a method for producing a wiring substrate.

BACKGROUND ART

A wiring substrate including an insulating layer and a wiring part disposed on a front surface of the insulating layer may be configured such that the wiring part has a multilayer structure including conductive layers formed by performing a plating process on a conductive base layer a plurality of times.

Depending on the circuit structure of the wiring substrate, the wiring substrate may include a wiring part that is insulated from other wiring parts and electrically isolated on the insulating layer, in other words, that is not electrically continuous to the outside. According to a known method for forming such an isolated wiring part by electroplating, an auxiliary line is provided to electrically connect the wiring part to another wiring part that is electrically accessible. The auxiliary line is removed to isolate the wiring part after electroplating (see PTL 1).

According to this method, a mask layer is placed on a non-plating region including the auxiliary line during electroplating, that is, when a conductive covering layer of the wiring part is formed, and is removed after electroplating. After that, the auxiliary line is removed by etching.

CITATION LIST

Patent Literature

PTL 1: Japanese Unexamined Patent Application Publication No. 2013-69876

SUMMARY OF INVENTION

Technical Problem

According to the method of PTL 1, depending on the shape of the mask layer, the adhesion strength of the conductive covering layer may be reduced or a foreign plating object may be formed in the non-plating region. Such defects degrade the quality of the wiring substrate.

According to an aspect of the present disclosure, it is preferable to provide a high-quality wiring substrate including an electrically isolated wiring part.

Solution to Problem

A wiring substrate according to an embodiment of the present disclosure includes an insulating layer having a front surface and a back surface and at least two wiring parts that are disposed at least on the front surface of the insulating layer and that are insulated from each other. At least one of the at least two wiring parts is electrically isolated on the insulating layer. Each of the at least two wiring parts includes a conductive base layer disposed on the front surface of the insulating layer, a conductive layer disposed on a front surface of the conductive base layer, and a conductive covering layer arranged to cover at least a portion of a front surface of the conductive layer, at least a portion of a side surface of the conductive base layer, and at least a portion of a side surface of the conductive layer. The conductive base layer and the conductive layer overlap and coincide with each other in plan view.

Referring to FIG. 9, a wiring part 103 disposed on an insulating layer 102 includes a conductive covering layer 133 that is disposed on a front surface of a conductive layer 132 and that includes a portion P that is placed directly on a conductive base layer 131. In this case, an undercut, which is a recess toward the inside of the wiring part 103, is formed at that portion P when the mask layer used to form the conductive covering layer 133 is removed by etching. As a result, the adhesion strength of the conductive covering layer 133 is reduced, and separation of the conductive covering layer 133 may occur due to, for example, hydraulic pressure.

In contrast, according to the structure of the present disclosure, the conductive base layer and the conductive layer overlap and coincide with each other in plan view. Therefore, the conductive covering layer is prevented from being placed directly on the conductive base layer. Accordingly, formation of the above-described undercut is suppressed, and the adhesion strength of the conductive covering layer is increased. As a result, the quality of the wiring substrate including the electrically isolated wiring part can be improved.

Here, the expression "electrically isolated on the insulating layer" means that the wiring part is not electrically continuous to any other wiring part disposed on the same insulating layer or to an external terminal through a via conductor or the like that extends through the insulating layer in the thickness direction.

According to an embodiment of the present disclosure, an outermost layer of the conductive layer at a front side of the conductive layer and an outermost layer of the conductive covering layer that is in contact with the conductive layer may contain the same type of metal. According to this configuration, the adhesion strength between the conductive layer and the conductive covering layer is further increased, so that the quality is further improved.

According to an embodiment of the present disclosure, non-covered regions of the conductive layer and the conductive base layer that are not covered by the conductive covering layer may be covered with an oxide film. According to this configuration, the corrosion resistance of the conductive layer and the conductive base layer can be increased.

Another embodiment of the present disclosure is a method for producing a wiring substrate including an insulating layer having a front surface and a back surface and at least two wiring parts that are disposed at least on the front surface of the insulating layer and that are insulated from each other, at least one of the at least two wiring parts being electrically isolated on the insulating layer. The method includes a step of forming a conductive pretreatment layer on the front surface of the insulating layer; a step of forming at least two conductive layers on a front surface of the pretreatment layer; a step of forming a base pattern by etching the pretreatment layer, the base pattern including at least two conductive base layers, which each have one of the at least two conductive layers disposed on a front surface thereof, and an auxiliary line that connects the at least two conductive base layers to each other; a step of covering front surfaces of the at least two conductive layers with respective conductive covering layers; and a step of removing the auxiliary line. The step of covering includes a step of placing a mask layer to cover the base pattern, a step of forming the conductive covering layers by electroplating while the mask layer is present, and a step of removing the mask layer. The mask layer is placed to cover connecting portions of the base pattern at which the auxiliary line is connected to the at least two conductive base layers in the step of placing the mask layer. Here, the term "connecting portions" means boundary portions between the auxiliary line and the conductive base layers in plan view.

According to this configuration, when electroplating is performed to form the conductive covering layers, the conductive covering layers are prevented from being placed directly on the conductive base layers. Therefore, formation of the undercut is suppressed in the step of removing the mask layer, and the adhesion strength of the conductive covering layers is increased. As a result, a high-quality wiring substrate including an electrically isolated wiring part can be obtained.

According to an embodiment of the present disclosure, the mask layer may be placed to cover a side surface of the auxiliary line in the step of placing the mask layer.

If the mask layer covers only the front surface of the auxiliary line during electroplating performed to form the conductive covering layers, a plating layer may be formed on a side surface of the auxiliary line. This plating layer may not be removed in the step of removing the auxiliary line and may remain as a foreign plating object.

In contrast, according to the above-described configuration, when electroplating is performed to form the conductive covering layers, formation of a plating layer that serves as the foreign plating object is suppressed in a region adjacent to the side surface of the auxiliary line. As a result, the quality of the wiring substrate can be improved.

According to an embodiment of the present disclosure, the mask layer may be placed to cover portions of the front surfaces of the at least two conductive layers in the step of placing the mask layer. According to this configuration, the conductive covering layers are more reliably prevented from being placed directly on the conductive base layers. In addition, precision requirements on the shape of the mask layer can be reduced, so that the wiring substrate can be more easily produced.

According to an embodiment of the present disclosure, the method may further include a step of heating the at least two conductive layers and the at least two conductive base layers in atmospheric air after the step of removing the auxiliary line. According to this configuration, non-covered regions of the conductive layers and the conductive base layers that are not covered by the conductive covering layers can be covered with an oxide film. As a result, the corrosion resistance of the non-covered regions can be increased.

Another embodiment of the present disclosure is a method for producing a wiring substrate including an insulating layer having a front surface and a back surface and at least two wiring parts that are disposed at least on the front surface of the insulating layer and that are insulated from each other, at least one of the at least two wiring parts being electrically isolated on the insulating layer. The method includes a step of forming a conductive pretreatment layer on the front surface of the insulating layer; a step of forming at least two conductive layers on a front surface of the pretreatment layer; a step of forming a base pattern by etching the pretreatment layer, the base pattern including at least two conductive base layers, which each have one of the at least two conductive layers disposed on a front surface thereof, and an auxiliary line that connects the at least two conductive base layers to each other; a step of covering front surfaces of the at least two conductive layers with respective conductive covering layers; and a step of removing the auxiliary line. The step of covering includes a step of placing a mask layer to cover the base pattern, a step of forming the conductive covering layers by electroplating while the mask layer is present, and a step of removing the mask layer. The mask layer is placed to cover a side surface of the auxiliary line in the step of placing the mask layer.

According to this configuration, when electroplating is performed to form the conductive covering layers, formation of a plating layer that serves as the foreign plating object is suppressed in a region adjacent to the side surface of the auxiliary line. As a result, a high-quality wiring substrate including an electrically isolated wiring part can be obtained.

According to an embodiment of the present disclosure, the method may further include a step of heating the at least two conductive layers and the at least two conductive base layers in atmospheric air after the step of removing the auxiliary line. According to this configuration, non-covered regions of the conductive layers and the conductive base layers that are not covered by the conductive covering layers can be covered with an oxide film. As a result, the corrosion resistance of the non-covered regions can be increased.

REFERENCE SIGNS LIST

1 . . . wiring substrate, 2 . . . insulating layer, 3 . . . first wiring part, 4 . . . second wiring part, 5 . . . third wiring part, 6 . . . via conductor, 10 . . . front-side pretreatment layer, 11 . . . base pattern, 12 . . . auxiliary line, 13A, 13B . . . connecting portion, 20 . . . back-side pretreatment layer, 31 . . . conductive base layer, 32 . . . conductive layer, 33 . . . conductive covering layer, 41 . . . conductive base layer, 42 . . . conductive layer, 43 . . . conductive covering layer, 51 . . . conductive base layer, 52 . . . conductive layer, M10, M11, M12, M20, M21, M22, M23 . . . mask layer

DESCRIPTION OF EMBODIMENTS

An embodiment of the present disclosure will now be described with reference to the drawings.

1. First Embodiment

[1-1. Wiring Substrate]

Figure 1:
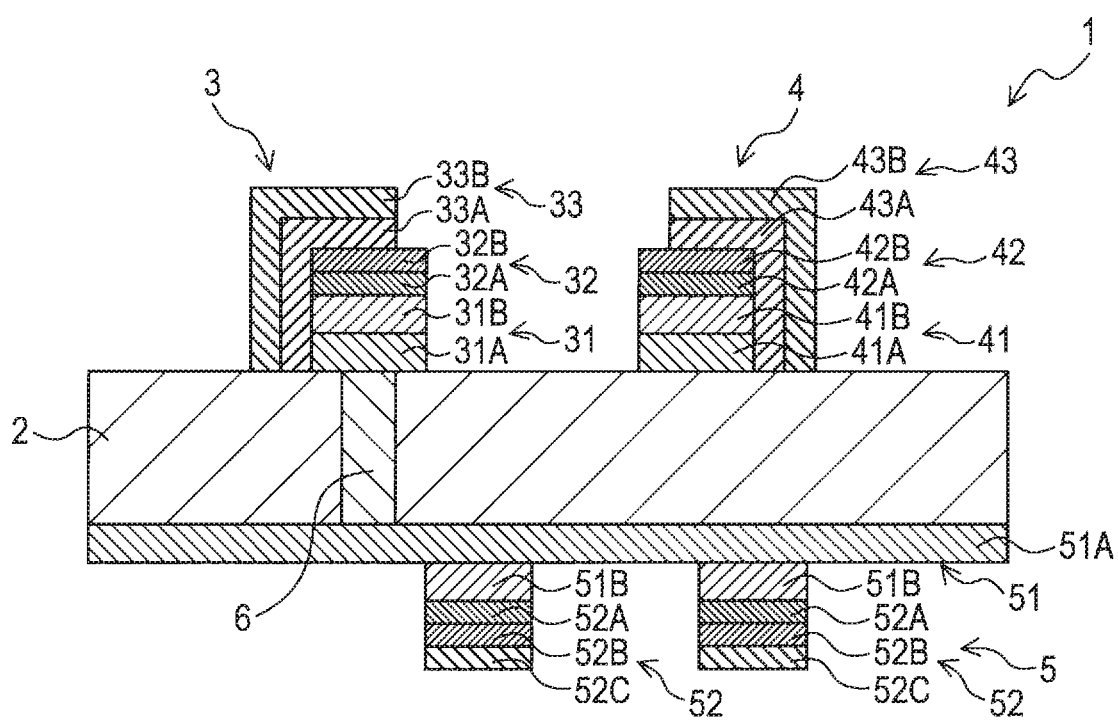
FIG. 1 is a schematic sectional view of a wiring substrate according to an embodiment.

A wiring substrate 1 illustrated in FIG. 1 includes an insulating layer 2 having a front surface and a back surface, a first wiring part 3, a second wiring part 4, a third wiring part 5, and a via conductor 6.

<Insulating Layer>

The insulating layer 2 is a sheet-shaped member made of a ceramic. The ceramic that forms the insulating layer 2 may be, for example, alumina, beryllia, aluminum nitride, boron nitride, silicon nitride, or glass. Each of these ceramics may be used individually, or two or more of the ceramics may be used in combination with each other.

<First Wiring Part and Second Wiring Part>

The first wiring part 3 and the second wiring part 4 are disposed on the front surface of the insulating layer 2. The first wiring part 3 and the second wiring part 4 are insulated from each other.

The first wiring part 3 is electrically continuous with the third wiring part 5 through the via conductor 6. The first wiring part 3 is electrically connected to an external terminal through the third wiring part 5. The second wiring part 4 is not electrically connected to any other wiring part, and is electrically isolated on the insulating layer 2.

As illustrated in FIG. 1, the first wiring part 3 includes a conductive base layer 31, a conductive layer 32, and a conductive covering layer 33. The conductive base layer 31, the conductive layer 32, and the conductive covering layer 33 each have a two-layer structure.

More specifically, the conductive base layer 31 includes a first conductive base layer 31A and a second conductive base layer 31B. The conductive layer 32 includes a first conductive layer 32A and a second conductive layer 32B. The conductive covering layer 33 includes a first conductive covering layer 33A and a second conductive covering layer 33B.

Similarly, the second wiring part 4 includes a conductive base layer 41, a conductive layer 42, and a conductive covering layer 43. The conductive base layer 41, the conductive layer 42, and the conductive covering layer 43 each have a two-layer structure.

More specifically, the conductive base layer 41 includes a first conductive base layer 41A and a second conductive base layer 41B. The conductive layer 42 includes a first conductive layer 42A and a second conductive layer 42B. The conductive covering layer 43 includes a first conductive covering layer 43A and a second conductive covering layer 43B.

The above-described layers included in the second wiring part 4 have the same structures (for example, materials and arrangements) as those of the layers included in the first wiring part 3. Therefore, the layers included in the first wiring part 3 will be described below.

(Conductive Base Layer)

The conductive base layer 31 includes the first conductive base layer 31A disposed on the front surface of the insulating layer 2 and the second conductive base layer 31B disposed on a front surface of the first conductive base layer 31A. The first conductive base layer 31A and the second conductive base layer 31B have the same shape in plan view (that is, when viewed in the thickness direction). Although the first conductive base layer 31A of the first wiring part 3 is connected to the via conductor 6, the first conductive base layer 41A of the second wiring part 4 is not connected to any via conductor.

The materials of the conductive base layer 31 are not particularly limited as long as the materials are conductive. For example, the first conductive base layer 31A may be made of titanium (Ti), and the second conductive base layer 31B may be made of copper (Cu).

(Conductive Layer)

The conductive layer 32 includes the first conductive layer 32A disposed on a front surface of the second conductive base layer 31B and the second conductive layer 32B disposed on a front surface of the first conductive layer 32A. The first conductive layer 32A and the second conductive layer 32B have the same shape in plan view.

The materials of the conductive layer 32 are not particularly limited as long as the materials are conductive. For example, the first conductive layer 32A may be made of copper (Cu), and the second conductive layer 32B may be made of nickel (Ni). The second conductive base layer 31B, which is the outermost layer of the conductive base layer 31 at a front side thereof, and the first conductive layer 32A, which is a layer of the conductive layer 32 that is in contact with the second conductive base layer 31B, may contain the same type of metal (for example, copper). In such a case, the adhesion between the conductive base layer 31 and the conductive layer 32 can be increased.

The conductive base layer 31 overlaps and coincides with the conductive layer 32 in plan view, and does not protrude from the conductive layer 32. In other words, the entire front surface of the second conductive base layer 31B is covered by the first conductive layer 32A.

(Conductive Covering Layer)

The conductive covering layer 33 is arranged to cover a portion of a front surface of the conductive layer 32, a portion of a side surface of the conductive base layer 31, and a portion of a side surface of the conductive layer 32.

More specifically, the conductive covering layer 33 covers a portion of a front surface of the second conductive layer 32B and portions of the side surfaces of the conductive base layer 31 and the conductive layer 32 that are far from the second wiring part 4 (that is, that do not face the second wiring part 4).

As described above, the front surface of the conductive base layer 31 is covered by the conductive layer 32. Therefore, the conductive covering layer 33 is only in contact with the side surface of the conductive base layer 31, and is not in contact with the front surface of the conductive base layer 31.

The first conductive covering layer 33A disposed on a front surface of the second conductive layer 32B and the second conductive covering layer 33B disposed on a front surface of the first conductive covering layer 33A have the same shape in the region where the first conductive covering layer 33A and the second conductive covering layer 33B overlap the conductive layer 32 in plan view.

The materials of the conductive covering layer 33 are not particularly limited as long as the materials are conductive. For example, the first conductive covering layer 33A may be made of nickel (Ni), and the second conductive covering layer 33B may be made of gold (Au).

The second conductive layer 32B, which is the outermost layer of the conductive layer 32 at a front side thereof, and the first conductive covering layer 33A, which is the outermost layer of the conductive covering layer 33 that is in contact with the second conductive layer 32B, may contain the same type of metal (for example, nickel). In such a case, the adhesion the between conductive layer 32 and the conductive covering layer 33 can be increased.

The conductive layers 32 and 42 and the conductive base layers 31 and 41 of the first and second wiring parts 3 and 4 include non-covered regions that are not covered by the conductive covering layers 33 and 43. The non-covered regions are covered by an oxide film.

The above-described non-covered regions include regions of the front and side surfaces of the conductive layers 32 and 42 that are not covered with the conductive covering layers 33 and 43 and regions of the side surfaces of the conductive base layers 31 and 41 that are not covered with the conductive covering layers 33 and 43.

The above-described oxide film is made mainly of an oxide of a metal contained in the conductive layers 32 and 42 and the conductive base layers 31 and 41. The oxide film has a thickness of several angstroms to several tens of angstroms, for example, 10 Å. The above-described oxide film is formed on the conductive layers 32 and 42 and the conductive base layers 31 and 41 by heating the wiring substrate 1 in atmospheric air (that is, by an annealing process). Regions of the front and side surfaces of the conductive covering layers 33 and 43 that are not in contact with the conductive layers 32 and 42 or the conductive base layers 31 and 41 may also be covered with the oxide film.

<Third Wiring Part>

The third wiring part 5 is disposed on the back surface of the insulating layer 2. The third wiring part 5 includes a conductive base layer 51 and a plurality of conductive layers 52.

The conductive base layer 51 is disposed on the back surface of the insulating layer 2, and has a two-layer structure. The conductive base layer 51 includes a first conductive base layer 51A disposed on the back surface of the insulating layer 2 and a plurality of second conductive base layers 51B disposed on a back surface of the first conductive base layer 51A with a gap provided between each other. The first conductive base layer 51A is connected to the via conductor 6. When referring to the third wiring part 5, the term "back surface" means a surface that faces away from the insulating layer 2.

The materials of the conductive base layer 51 are not particularly limited as long as the materials are conductive. For example, the first conductive base layer 51A may be made of titanium (Ti), and the second conductive base layers 51B may be made of copper (Cu).

The conductive layers 52 are disposed on back surfaces of the second conductive base layers 51B, and each have a three-layer structure. Each conductive layer 52 includes a first conductive layer 52A disposed on a back surface of the corresponding second conductive base layer 51B, a second conductive layer 52B disposed on a back surface of the first conductive layer 52A, and a third conductive layer 52C disposed on a back surface of the second conductive layer 52B. The first conductive layer 52A, the second conductive layer 52B, and the third conductive layer 52C have the same shape in plan view.

The materials of the conductive layers 52 are not particularly limited as long as the materials are conductive. For example, the first conductive layer 52A may be made of copper (Cu), the second conductive layer 52B may be made of nickel (Ni), and the third conductive layer 52C may be made of gold (Au).

<Via Conductor>

The via conductor 6 is a conductor that extends through the insulating layer 2 in the thickness direction. The via conductor 6 electrically connects the first wiring part 3 and the third wiring part 5 to each other.

[1-2. Method for Producing Wiring Substrate]

A method for producing the wiring substrate 1 will now be described.

Figure 2:
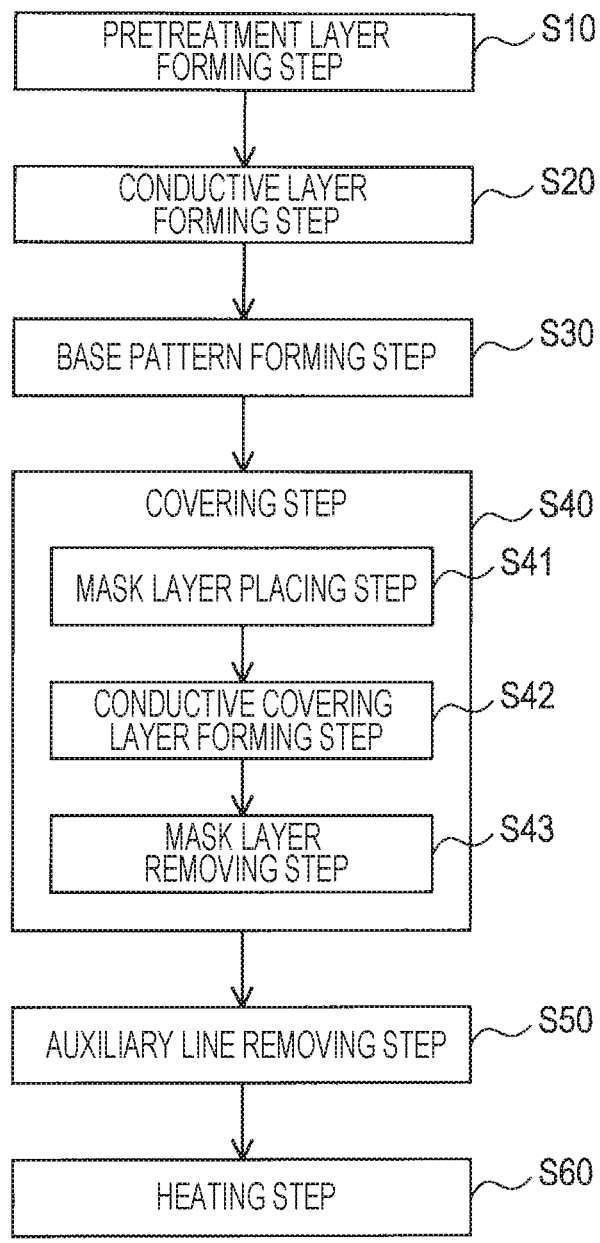
FIG. 2 is a flowchart of a method for producing the wiring substrate according to the embodiment.

As illustrated in FIG. 2, the method for producing the wiring substrate according to the present embodiment includes a pretreatment layer forming step S10, a conductive layer forming step S20, a base pattern forming step S30, a covering step S40, an auxiliary line removing step S50, and a heating step S60.

<Pretreatment Layer Forming Step>

Figure 3:
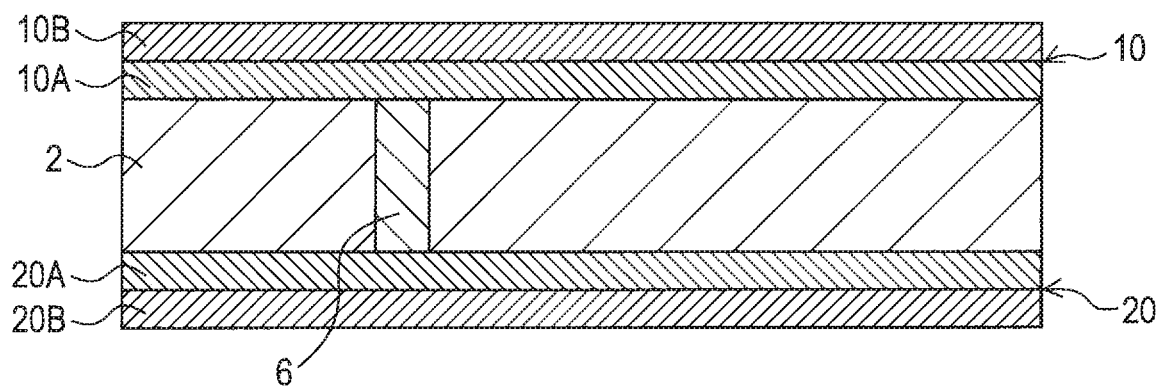
FIG. 3 is a schematic sectional view illustrating a step of the method for producing the wiring substrate.

In this step, as illustrated in FIG. 3, a front-side pretreatment layer 10, which has a two-layer structure and is conductive, is formed on the front surface of the insulating layer 2 having the via conductor 6. In addition, a back-side pretreatment layer 20, which also has a two-layer structure and is conductive, is formed on the back surface of the insulating layer 2 at the same time.

The front-side pretreatment layer 10 includes portions that serve as the conductive base layer 31 of the first wiring part 3 and the conductive base layer 41 of the second wiring part 4. The back-side pretreatment layer 20 includes a portion that serves as the conductive base layer 51 of the third wiring part 5.

The front-side pretreatment layer 10 and the back-side pretreatment layer 20 may each be formed by, for example, metal sputtering. More specifically, a first front-side pretreatment layer 10A and a first back-side pretreatment layer 20A are formed on the front and back surfaces of the insulating layer 2 by Ti sputtering, and a second front-side pretreatment layer 10B and a second back-side pretreatment layer 20B are additionally formed by Cu sputtering.

<Conductive Layer Forming Step>

In this step, the conductive layer 32 of the first wiring part 3 and the conductive layer 42 of the second wiring part 4 are formed on a front surface of the second front-side pretreatment layer 10B. In addition, the conductive layers 52 of the third wiring part 5 are formed on a back surface of the second back-side pretreatment layer 20B.

Figure 4A:
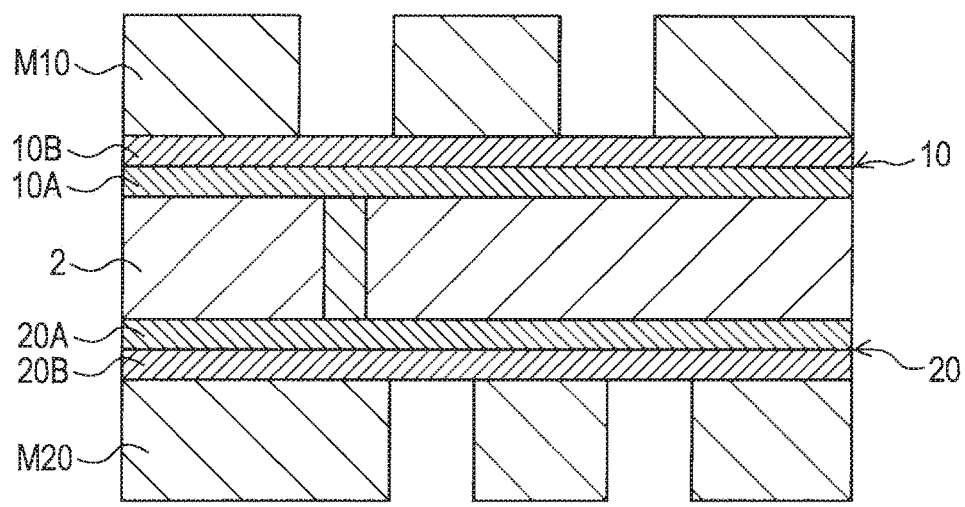
FIG. 4A is a schematic sectional view illustrating a step subsequent to the step illustrated in FIG. 3.

More specifically, first, as illustrated in FIG. 4A, a mask layer M10 is placed on the front surface of the second front-side pretreatment layer 10B, and a mask layer M20 is placed on the back surface of the second back-side pretreatment layer 20B. The mask layers M10 and M20 cover the pretreatment layers in regions where no conductive layers are to be formed. The mask layers M10 and M20 are formed of, for example, a resist.

Figure 4B:
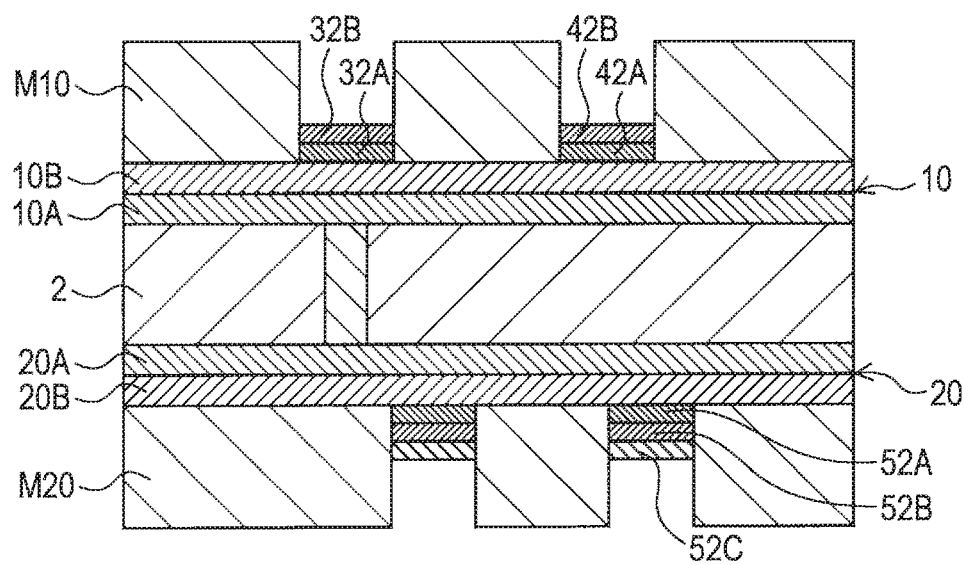
FIG. 4B is a schematic sectional view illustrating a step subsequent to the step illustrated in FIG. 4A.

After the mask layers M10 and M20 are placed, as illustrated in FIG. 4B, electroplating is performed a plurality of times at the front and back sides of the insulating layer 2. Thus, the conductive layer 32 of the first wiring part 3, the conductive layer 42 of the second wiring part 4, and the conductive layers 52 of the third wiring part 5 are formed. In this step, electroplating is performed to form the conductive layer 42 by supplying electricity to a region where the second wiring part 4 is to be formed through the front-side pretreatment layer 10.

Figure 4C:
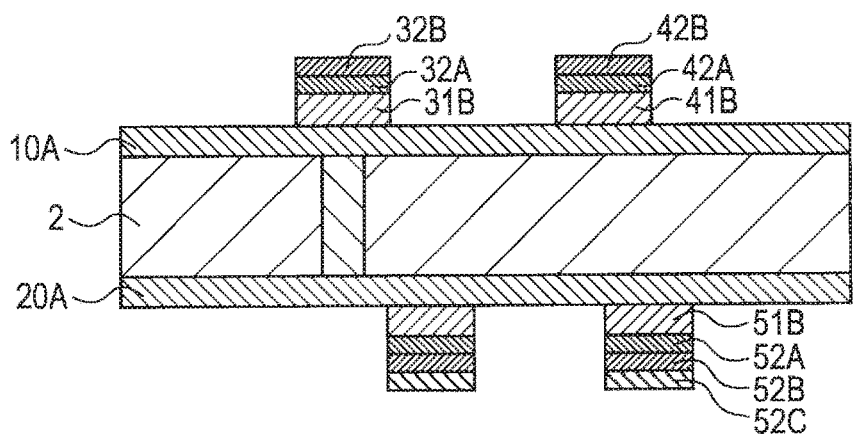
FIG. 4C is a schematic sectional view illustrating a step subsequent to the step illustrated in FIG. 4B.

After the conductive layers are formed, as illustrated in FIG. 4C, the resist is removed, and the second front-side pretreatment layer 10B and the second back-side pretreatment layer 20B are etched by using the conductive layers as masks. Thus, the second conductive base layer 31B of the first wiring part 3, the second conductive base layer 41B of the second wiring part 4, and the second conductive base layers 51B of the third wiring part 5 are formed.

<Base Pattern Forming Step>

In this step, the first front-side pretreatment layer 10A is etched to form a base pattern 11 including the conductive base layer 31 having the conductive layer 32 disposed on the front surface thereof, the conductive base layer 41 having the conductive layer 42 disposed on the front surface thereof, and an auxiliary line 12 that connects the conductive base layers 31 and 41 to each other.

Figure 5A:
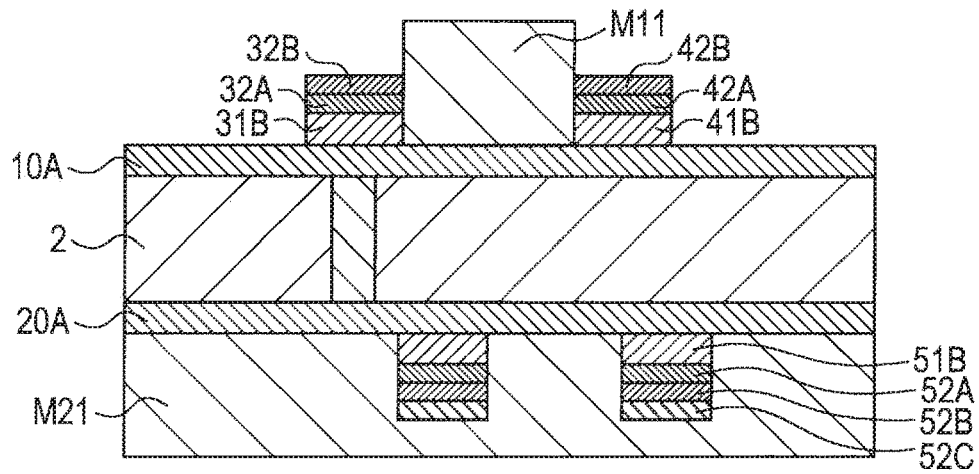
FIG. 5A is a schematic sectional view illustrating a step subsequent to the step illustrated in FIG. 4C.

More specifically, first, as illustrated in FIG. 5A, a mask layer M11 is placed to cover a portion of the first front-side pretreatment layer 10A in a region where the auxiliary line 12 is to be formed. At the same time, a mask layer M21 is placed to cover the entire region of the insulating layer 2 at the back side thereof.

Figure 5B:
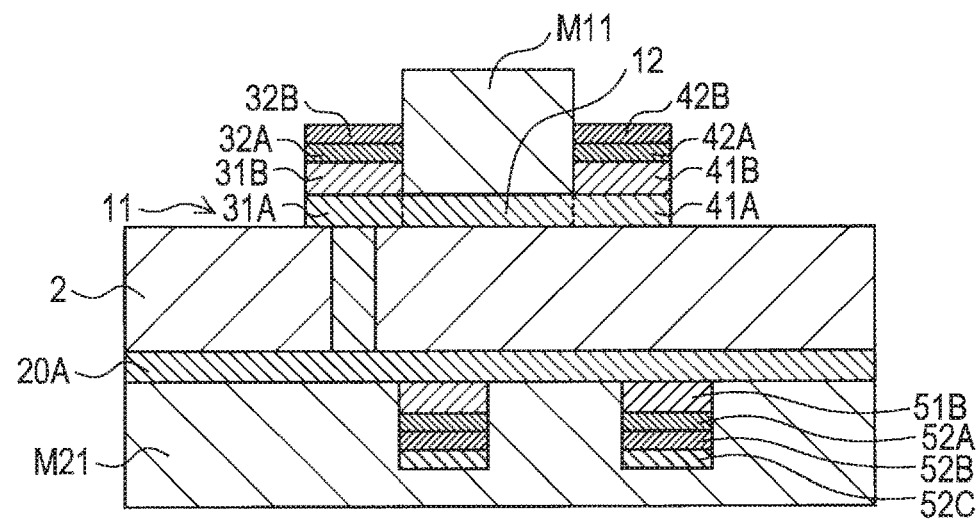
FIG. 5B is a schematic sectional view illustrating a step subsequent to the step illustrated in FIG. 5A.
Figure 5C:
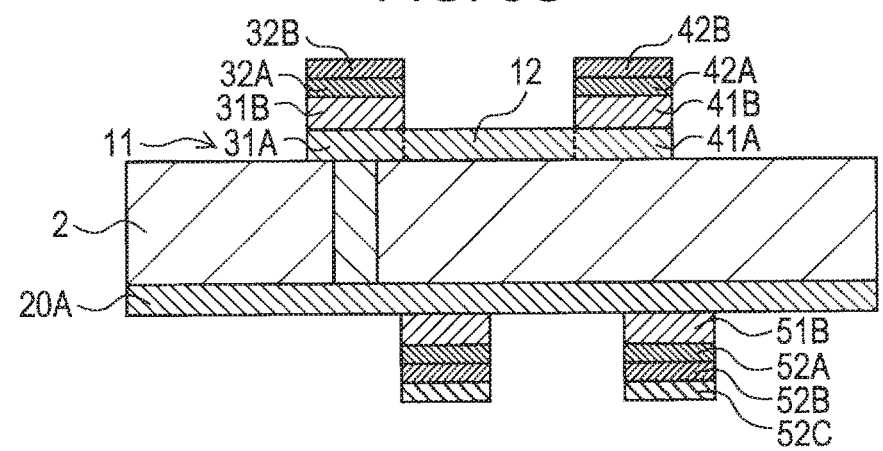
FIG. 5C is a schematic sectional view illustrating a step subsequent to the step illustrated in FIG. 5B.

Next, as illustrated in FIG. 5B, the first front-side pretreatment layer 10A is etched to remove a portion thereof that is not covered by the mask layer M11 or the two conductive layers 32 and 42. Thus, the base pattern 11 including the auxiliary line 12 is formed. After the base pattern 11 is formed, as illustrated in FIG. 5C, the mask layers M11 and M21 are removed.

<Covering Step>

In this step, the front surfaces of the conductive layer 32 of the first wiring part 3 and the conductive layer 42 of the second wiring part 4 are respectively covered with the conductive covering layers 33 and 43. This step includes a mask layer placing step S41, a conductive covering layer forming step S42, and a mask layer removing step S43.

(Mask Layer Placing Step)

Figure 6A:
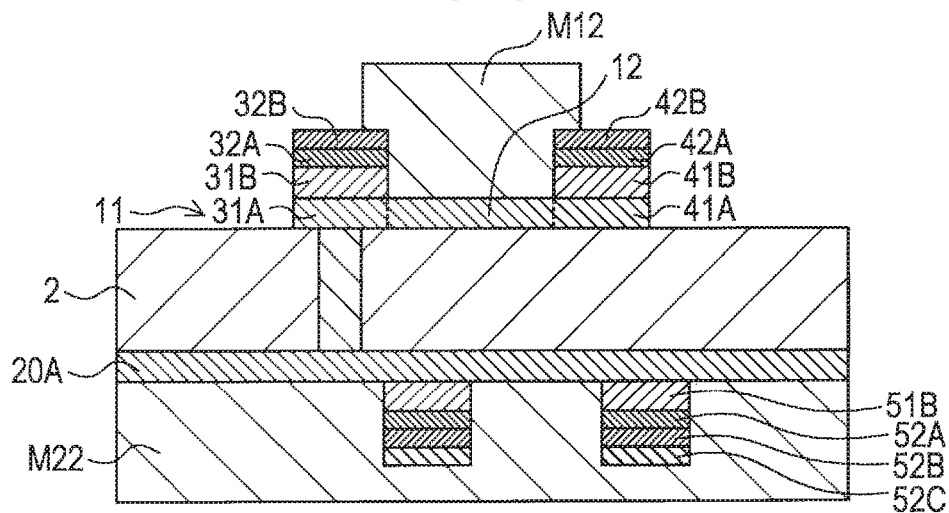
FIG. 6A is a schematic sectional view illustrating a step subsequent to the step illustrated in FIG. 5C.

In this step, as illustrated in FIG. 6A, a mask layer M12 is placed to cover the base pattern 11. In addition, in this step, a mask layer M22 is placed to cover the entire region of the insulating layer 2 at the back side thereof.

Figure 7A:
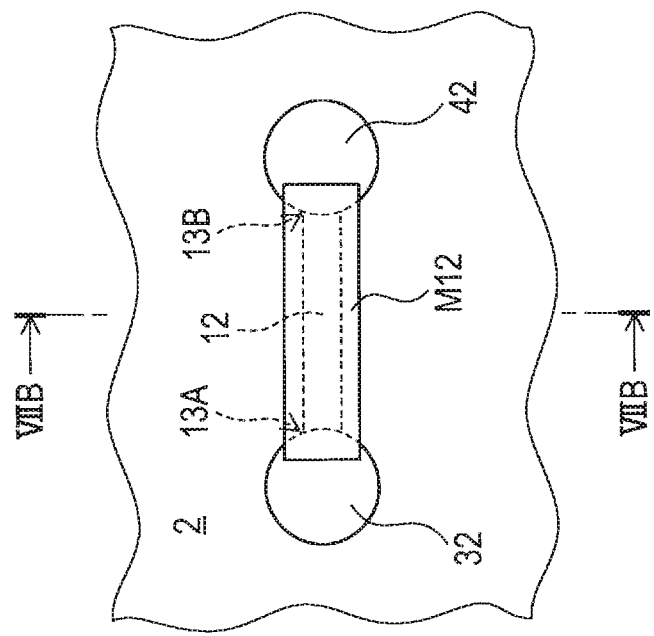
FIG. 7A is an enlarged schematic plan view of a region including an auxiliary line in the step illustrated in FIG. 6A.

The mask layer M12 covers the base pattern 11 in a region where the conductive covering layers 33 and 43 are not to be formed. More specifically, as illustrated in FIG. 7A, the mask layer M12 is arranged to cover a portion of the base pattern 11 including the entire front surface of the auxiliary line 12, a connecting portion 13A, and a connecting portion 13B. The connecting portion 13A connects the first conductive base layer 31A (placed under the conductive layer 32 in FIG. 7A) of the first wiring part 3 and the auxiliary line 12. The connecting portion 13B connects the first conductive base layer 41A (placed under the conductive layer 42 in FIG. 7A) of the second wiring part 4 and the auxiliary line 12. The mask layer M12 is also arranged to cover portions of the front surfaces of the conductive layer 32 of the first wiring part 3 and the conductive layer 42 of the second wiring part 4.

In addition, the mask layer M12 is arranged to cover portions of the side surfaces of the conductive layer 32 of the first wiring part 3 and the conductive layer 42 of the second wiring part 4 that face each other and portions of the side surfaces of the second conductive base layer 31B of the first wiring part 3 and the second conductive base layer 41B of the second wiring part 4 that face each other.

Figure 7B:
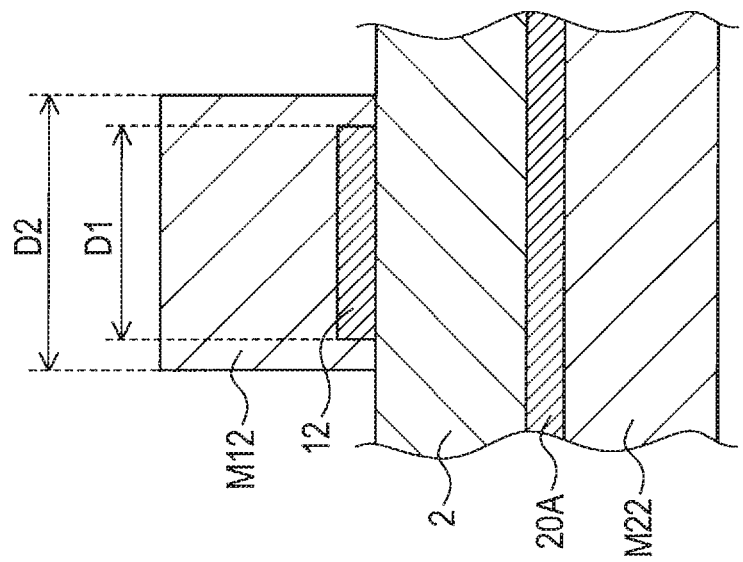
FIG. 7B is a schematic sectional view taken along line VIIB-VIIB in FIG. 7A.

In addition, as illustrated in FIG. 7B, the mask layer M12 is arranged to cover the entire side surfaces of the auxiliary line 12 between the conductive layer 32 of the first wiring part 3 and the conductive layer 42 of the second wiring part 4. A width D2 of the mask layer M12 in a direction perpendicular to the side surfaces of the auxiliary line 12 is preferably greater than or equal to 1.2 times a width D1 of the auxiliary line 12, more preferably greater than or equal to 1.5 times the width D1 of the auxiliary line 12.

(Conductive Covering Layer Forming Step)

Figure 6B:
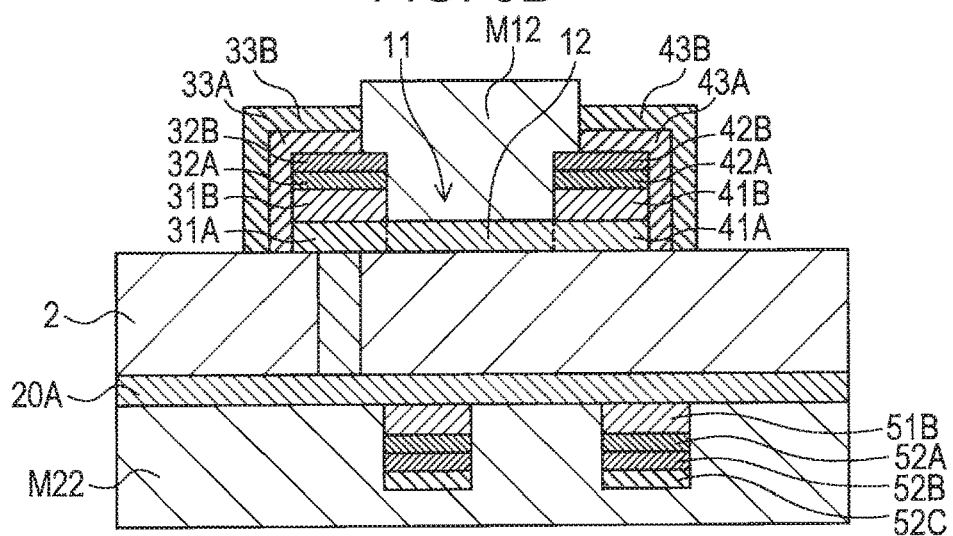
FIG. 6B is a schematic sectional view illustrating a step subsequent to the step illustrated in FIG. 6A.

In this step, as illustrated in FIG. 6B, the conductive covering layer 33 of the first wiring part 3 and the conductive covering layer 43 of the second wiring part 4 are formed by electroplating while the mask layers M12 and M22 are present. In this step, electroplating is performed to form the conductive covering layer 43 by supplying electricity to the region where the second wiring part 4 is to be formed through the auxiliary line 12.

(Mask Layer Removing Step)

Figure 6C:
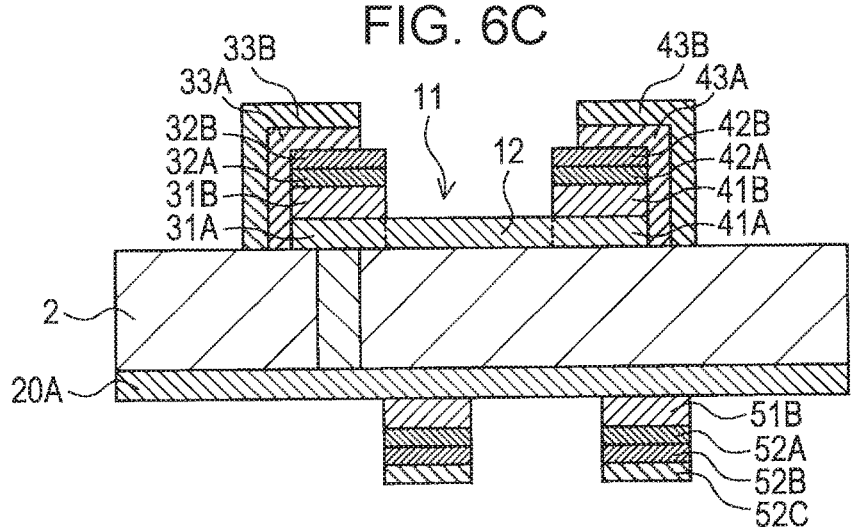
FIG. 6C is a schematic sectional view illustrating a step subsequent to the step illustrated in FIG. 6B.

In this step, as illustrated in FIG. 6C, the mask layers M12 and M22 are removed. In this state, the first wiring part 3 and the second wiring part 4 are electrically continuous to each other through the auxiliary line 12.

<Auxiliary Line Removing Step>

Figure 8A:
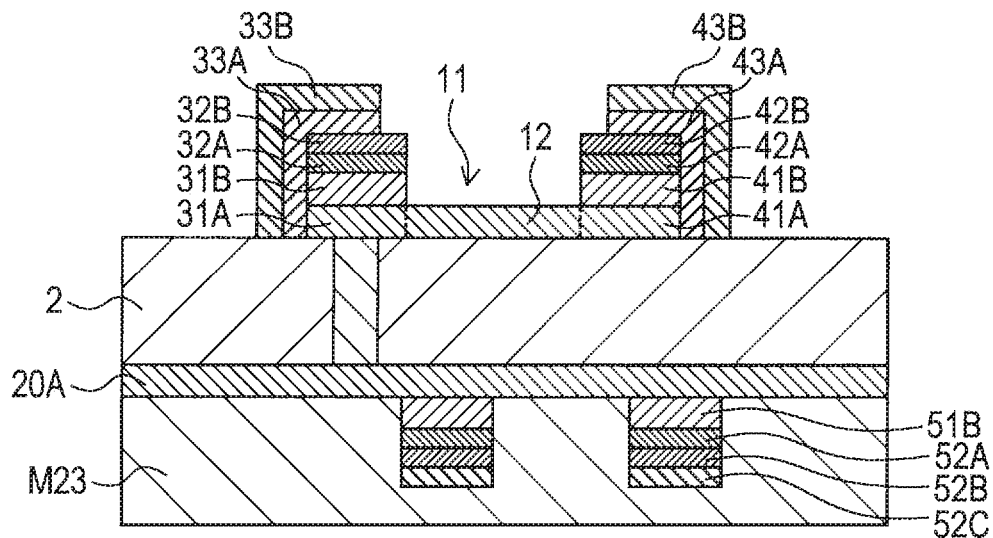
FIG. 8A is a schematic sectional view illustrating a step subsequent to the step illustrated in FIG. 6C.
Figure 8B:
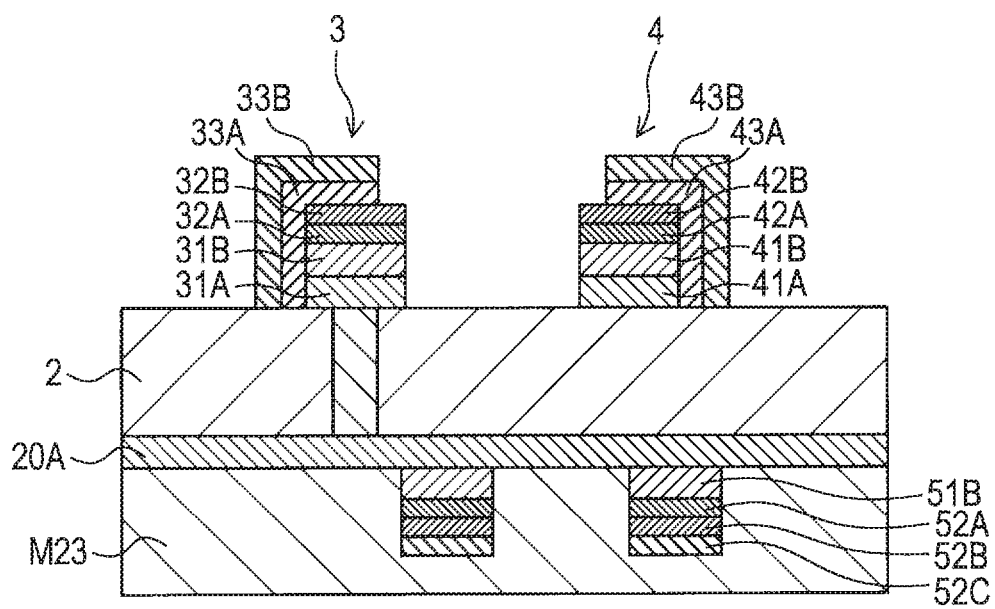
FIG. 8B is a schematic sectional view illustrating a step subsequent to the step illustrated in FIG. 8A.
Figure 9:
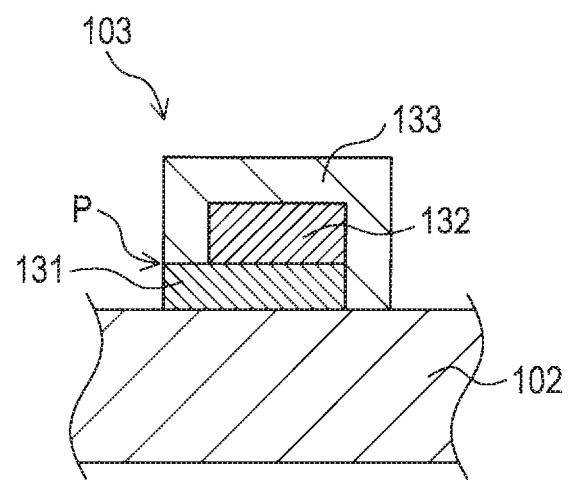
FIG. 9 is a schematic sectional view of a wiring substrate according to the related art.

In this step, the auxiliary line 12 is removed. More specifically, first, as illustrated in FIG. 8A, a mask layer M23 is placed to cover the entire region of the insulating layer 2 at the back side thereof.

Next, the auxiliary line 12 is removed by etching using the conductive covering layers 33 and 43 as masks. Accordingly, the first conductive base layer 31A of the first wiring part 3 and the first conductive base layer 41A of the second wiring part 4 are separated from each other, and the first wiring part 3 and the second wiring part 4 that are insulated from each other are formed. After the auxiliary line 12 is removed, the mask layer M23 is removed.

<Heating Step>

In this step, after the auxiliary line 12 is removed, the entire substrate including the conductive layers 32 and 42 and the conductive base layers 31 and 41 is subjected to an annealing process in which the substrate is heated in atmospheric air.

In this step, the heating temperature is, for example, higher than or equal to 250° C. and lower than or equal to 350° C. As a result of this step, an oxide film is formed on the exposed surfaces of the conductive layers 32 and 42, the conductive base layers 31 and 41, and the conductive covering layers 33 and 43. Thus, the wiring substrate 1 illustrated in FIG. 1 is obtained.

[1-3. Effects]

The embodiment described in detail above has the following effects.

(1a) Since the conductive base layers 31 and 41 respectively overlap and coincide with the conductive layers 32 and 42 in plan view, the conductive covering layers 33 and 43 are prevented from being placed directly on the conductive base layers 31 and 41.

Namely, when electroplating is performed to form the conductive covering layers 33 and 43, the conductive covering layers 33 and 43 are prevented from being placed directly on the conductive base layers 31 and 41. Therefore, formation of an undercut is suppressed in the mask layer removing step S43, and the adhesion strength of the conductive covering layers 33 and 43 is increased. As a result, a high-quality wiring substrate including an electrically isolated wiring part can be obtained.

(1b) Since the side surfaces of the auxiliary line 12 are covered by the mask layer M12 during electroplating performed to form the conductive covering layers 33 and 43, formation of a plating layer that serves as a foreign plating object is suppressed in regions adjacent to the side surfaces of the auxiliary line 12. As a result, the quality of the wiring substrate can be improved.

(1c) Since the mask layer M12 is arranged to cover portions of the front surfaces of the conductive layers 32 and 42 when electroplating is performed to form the conductive covering layers 33 and 43, the conductive covering layers 33 and 43 are more reliably prevented from being placed directly on the conductive base layers 31 and 41. In addition, precision requirements on the shape of the mask layer M12 can be reduced, so that the wiring substrate can be more easily produced.

(1d) Since the non-covered regions of the conductive layers 32 and 42 and the conductive base layers 31 and 41 are covered with the oxide film, the corrosion resistance of the conductive layers 32 and 42 and the conductive base layers 31 and 41 can be increased.

2. Other Embodiments

Although one embodiment of the present disclosure has been described above, the present disclosure is not limited to the above-described embodiment, and various embodiments are, of course, possible.

(2a) In the method for producing the wiring substrate according to the above-described embodiment, it is not necessary that the mask layer M12 cover the side surfaces of the auxiliary line 12 in the covering step S40 when the mask layer M12 is arranged to cover the connecting portions 13A and 13B between the auxiliary line 12 and the two conductive base layers 31 and 41.

Conversely, it is not necessary that the mask layer M12 cover the connecting portions 13A and 13B between the auxiliary line 12 and the two conductive base layers 31 and 41 in the covering step S40 when the mask layer M12 is arranged to cover the side surfaces of the auxiliary line 12.

For example, in the method for producing the wiring substrate according to the above-described embodiment, the mask layer M12 may be arranged to cover the front and side surfaces of the auxiliary line 12 without covering the front surfaces of the conductive layers 32 and 42 and without coming into contact with the side surfaces of the two conductive base layers 31 and 41 (that is, while being spaced from the side surfaces of the two conductive base layers 31 and 41) in the covering step S40.

In other words, the quality of the wiring substrate 1 can be improved as long as the mask layer M12 covers the connecting portions 13A and 13B between the auxiliary line 12 and the two conductive base layers 31 and 41 or the side surfaces of the auxiliary line 12.

(2b) The material of the insulating layer 2 included in the wiring substrate 1 according to the above-described embodiment is not limited to a ceramic. For example, the insulating layer 2 may instead be made of a resin.

(2c) The wiring substrate 1 according to the above-described embodiment may be configured such that the insulating layer 2 has no wiring part on the back surface thereof. In other words, the wiring substrate 1 may be a single-sided substrate. In addition, the wiring substrate 1 may include three or more wiring parts that are insulated from each other on the front surface of the insulating layer 2.

(2d) The wiring substrate 1 according to the above-described embodiment may be configured such that the conductive covering layers 33 and 43 cover the entire front surfaces of the conductive layers 32 and 42 and portions of the side surfaces of the conductive layers 32 and 42 that face each other. In other words, in the method for producing the wiring substrate according to the above-described embodiment, the mask layer M12 may be arranged to cover the side surfaces of the two conductive base layers 31 and 41 and the front surface of the auxiliary line 12 without covering the front surfaces of the conductive layers 32 and 42 in the covering step S40.

(2e) The structure of the layers included in each wiring part in the wiring substrate 1 according to the above-described embodiment is merely an example. More specifically, the conductive base layers 31 and 41, the conductive layers 32 and 42, and the conductive covering layers 33 and 43 may each have a single-layer structure or a multilayer structure including three or more layers.

(2f) In the wiring substrate 1 according to the above-described embodiment, the non-covered regions of the conductive layers 32 and 42 and the conductive base layers 31 and 41 are not necessarily covered with an oxide film. In other words, in the method for producing the wiring substrate according to the above-described embodiment, the heating step S60 may be omitted.

(2g) Functions of one component of the above-described embodiment may instead be provided by a plurality of components, and functions of a plurality of components of the above-described embodiment may instead be provided by a single component. In addition, a portion of the structure of the above-described embodiment may be omitted. Also, at least a portion of the structure of the above-described embodiment may be, for example, provided in addition to or in place of a portion in the structure of another embodiment. Any embodiment included in the technical concept specified by the wording of the claims is an embodiment of the present disclosure.

The invention claimed is:
1. A wiring substrate comprising:
an insulating layer having a front surface and a back surface; and
at least two wiring parts that are disposed at least on the front surface of the insulating layer and that are insulated from each other,
wherein at least one of the at least two wiring parts is electrically isolated on the insulating layer,
wherein each of the at least two wiring parts includes
a conductive base layer disposed on the front surface of the insulating layer,
a conductive layer disposed on a front surface of the conductive base layer, and
a conductive covering layer arranged to cover at least a portion of a front surface of the conductive layer, at least a portion of a side surface of the conductive base layer, and at least a portion of a side surface of the conductive layer,
wherein the conductive base layer and the conductive layer overlap such that, in plan view no portion of the conductive base layer protrudes past the conductive layer,
wherein regions of the front surface of the conductive layer, the side surface of the conductive base layer, and the side surface of the conductive layer include a non-covered region that is not covered by the conductive covering layer, wherein the non-covered regions of the conductive layer and the conductive base layer are covered with an oxide film, and wherein at least a portion of the front surface of the conductive layer is provided with the non-covered region of the conductive layer.

2. The wiring substrate according to claim 1, wherein an outermost layer of the conductive layer at a front side of the conductive layer and an outermost layer of the conductive covering layer that is in contact with the conductive layer contain same type of metal.

\* \* \* \* \*